United States Patent

[11] 3,602,779

[72] Inventor Claude Chapron
Caen Calvados, France

[21] Appl. No. 836,715
[22] Filed June 26, 1969
[45] Patented Aug. 31, 1971
[73] Assignee U.S. Philips Corporation
New York, N.Y.
[32] Priority June 27, 1968
[33] France
[31] 156891

[54] EPITAXIAL TRANSISTOR WITH LIMITED AREA BURIED LAYER AND LIFETIME KILLERS
3 Claims, 5 Drawing Figs.

[52] U.S. Cl. ........................................................ 317/235 R,
317/235 X, 317/235 Z, 317/235 AQ
[51] Int. Cl. ........................................................ H01l 11/06
[50] Field of Search ............................................ 317/235;
307/213, 303, 299 A

[56] References Cited

UNITED STATES PATENTS

| | | | |
|---|---|---|---|
| 3,260,902 | 7/1966 | Porter | 317/235 |
| 3,489,963 | 1/1970 | Gillett | 317/235 |
| 3,508,209 | 4/1970 | Agusta et al. | 317/235 |

*Primary Examiner*—Jerry D. Craig
*Attorney*—Frank R. Trifari

ABSTRACT: A transistor of the planar type with epitaxial layer and lifetime killers is described. A buried layer for reducing collector resistance is located directly under a collector contact and only that part of the base region which directly surrounds the emitter region, leaving an adjacent part of the base region free of the buried layer. This allows lifetime killers when diffused in from the back to spread throughout the collector and base region without sacrificing the collector resistance.

Figure 1A:
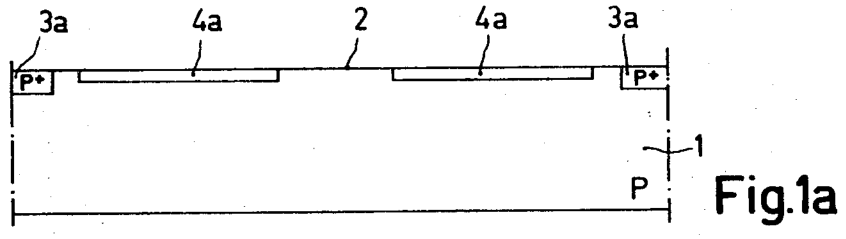
Figure 1B:
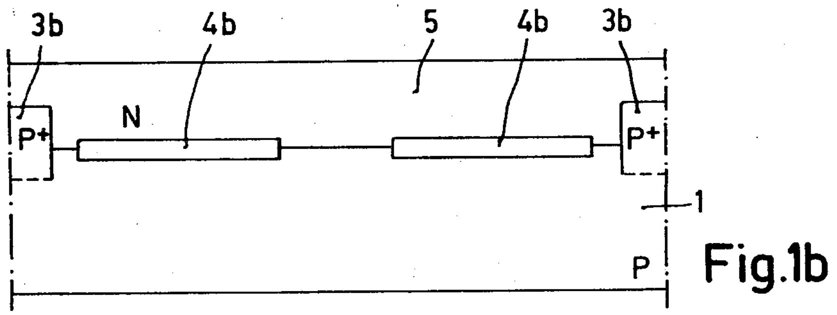
Figure 1C:
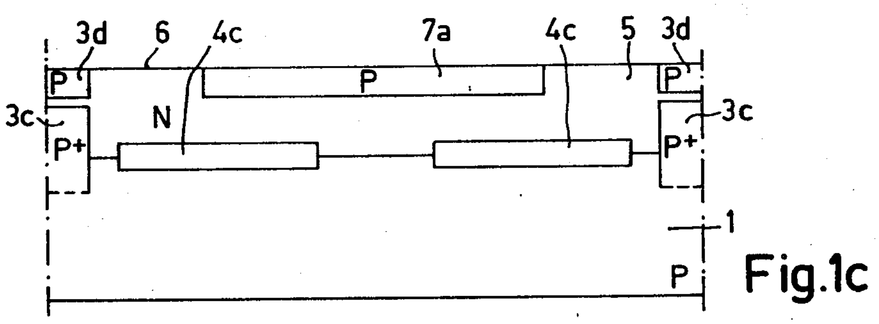

INVENTOR.
CLAUDE CHAPRON
BY
AGENT

*INVENTOR.*
CLAUDE CHAPRON
*BY*
AGENT

EPITAXIAL TRANSISTOR WITH LIMITED AREA BURIED LAYER AND LIFETIME KILLERS

The invention relates to a semiconductor device having a transistor comprising a semiconductor body with an epitaxial semiconductor layer provided on a semiconductor substrate, which layer comprises at least a part of the collector region of the transistor, said part surrounding the base region of the transistor, the base region surrounding the emitter region of the transistor, the collector region comprising a low-ohmic buried layer which is situated in a part of the semiconductor body adjoining the epitaxial layer and the substrate, the emitter-, base-, and collector-contacts being situated on the surface of the epitaxial layer, the substrate, the collector region and the base region comprising an impurity which reduced the lifetime of the charge carriers.

The buried layer serves to reduce the collector resistance. The impurity which reduces the lifetime of the charge carriers is provided so as to increase the switching speed of the transistor. Such an impurity is often termed "killer" and may consist of gold. The impurity is usually provided by diffusion after the regions of the transistor have already been obtained, in which the substrate is covered, for example, with a layer of gold which is then diffused via the substrate till in the collector region and the base region.

It has been found that such a diffusion process produces no regular, reproducible concentration of the impurity in the collector- and base-region, while said concentration, moreover, is very small.

It is the object of the invention to avoid this drawback.

The invention is based on the on the recognition of the fact that the buried layer exerts an inhibiting effect on the diffusion of the said impurity.

According to the invention, a semiconductor device of the type mentioned in the preamble is characterized in that the buried layer is situated below the collector contact and only below that part of the base region which surrounds the emitter region directly.

In a device according to the invention, the base region comprises parts below which the buried layer is not present, while this nevertheless has no adverse influence on the emitter-collector current since the buried layer is situated in the current path for said current.

Experiments have demonstrated that a transistor in a device according to the invention shows better properties than that in a known device, in which the buried layer is situated below the entire base region.

Upon diffusion of an impurity reducing the lifetime of the charge carriers via the substrate into the base region, said impurity can diffuse unhindered in that part of the base region below which the buried layer is not present and can spread from said part of the base region laterally throughout the base region.

Although it is thought that the above explanation of the invention is the correct one, the invention should not only be seen in connection with this explanation since more complex phenomena may contribute to the favorable result of the invention.

An important preferred embodiment of the semiconductor device according to the invention is characterized in that the transistor comprises a number of interconnected emitter regions which are each situated near the circumference of the base region and a number of interconnected collector contacts which are each situated near an emitter region, the buried layer consisting of a number of parts of which each part is situated below a collector contact and a part of the base region which directly surrounds the emitter region situated near said collector contact. In this embodiment the emitter collector current flows substantially entirely through parts of the base region near the circumference of the base region, while substantially no current flows through a central part of the base regions and an adjoining central part of the collector region. As a result of this a part of the buried layer below said sparingly active central parts may be omitted without objections.

In order that the invention may be readily carried into effect, one embodiment thereof will now be described in greater detail, by way of example, with reference to the accompanying drawing, in which FIGS. 1*a* to 1*d* are cross-sectional views of a number of stages of a part of a semiconductor device according to the invention during its manufacture.

Figure 1D:
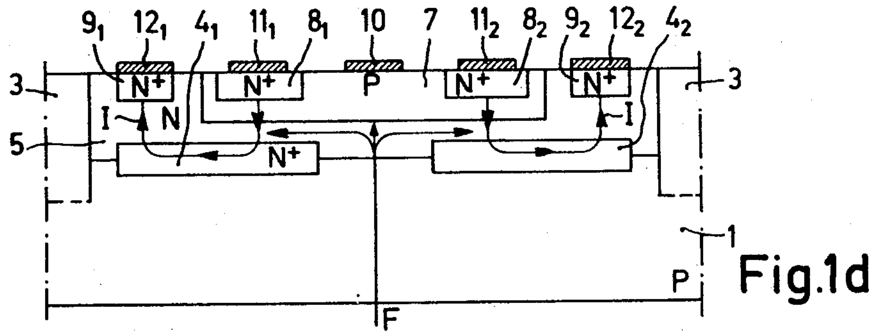
Figure 2:
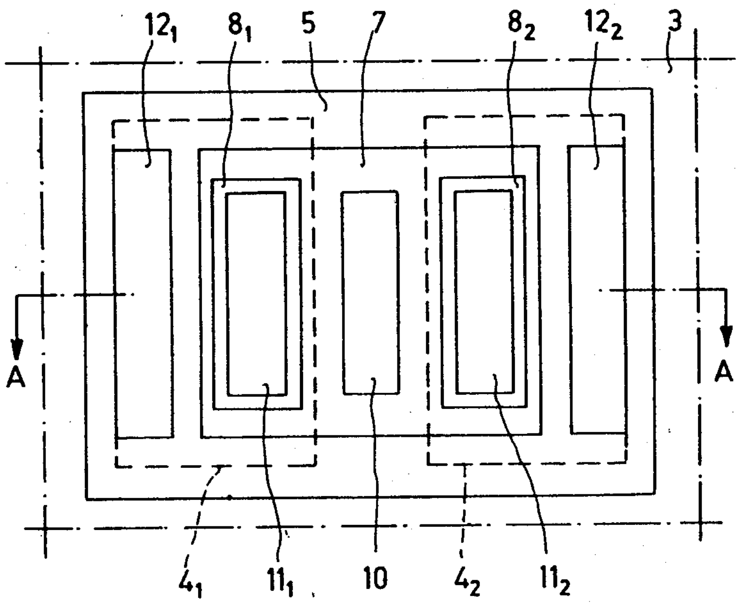

FIG. 2 is a plan view of a part of the semiconductor device shown in FIG. 1*d*.

The example relates to an NPN-transistor. However, the transistor may alternatively be a PNP-transistor in which the conductivity type of all the regions has to be changed.

Masking and passivating surface layers, for example, of silicon oxide, are not shown and are not described since the use of these layers is universally known. Moreover, the Figures become simpler and clearer by omitting said layers.

In manufacturing the semiconductor device according to FIGS. 1*d* and 2, the *p*-type silicon substrate 1 is used as the starting material. The substrate is provided by diffusion of impurities with the *p*+ regions 3*a* and the *n*-type regions 4*a* adjoining the surface 2. The regions 3*a* serve to obtain the isolation regions 3 and the regions 4*a* serve to obtain the parts $4_1$ and $4_2$ of the buried layer.

An *n*-type epitaxial silicon layer 5 is provided on the surface 2 of the substrate 1. The regions 3*a* and 3*b* diffuse slightly in the epitaxial layer, the regions 3*b* and 4*b* being formed. The *n*-type regions 4*b* are higher doped than the *n*-type epitaxial layer 5.

The *p*-type regions 3*d* and 7*a* adjoining the surface 6 are provided in the epitaxial layer by diffusion of an impurity. The regions 3*d* serve to form the insulating regions 3 and the region 7*a* serves to form the base region 7.

The *n*+ type surface regions $9_1$, $9_2$, $8_1$ and $8_2$ are then provided by diffusion of an impurity. The isolation regions 3, the base region 7 and the parts $4_1$ and $4_2$ are obtained from the regions 3*d* and 3*c*, the region 7*a* and the region 4*c*.

The regions $8_1$ and $8_2$ are the two emitter regions of the transistor and the regions $9_1$ and $9_2$ are the two collector contact regions of the transistor.

So in the present example the transistor comprises two emitter regions 8 which are situated near the circumference of the base region 7, while near each emitter region 8 a collector contact region 9 is situated which is provided with a collector contact 12 as is clearly shown in FIGS. 1*d* and 2.

The emitter regions 8 are provided with emitter contacts 11 and the base region is provided with a contact 10.

It is to be noted that the collector contact regions 9 may extend up to the buried layer 4.

In order to reduce the switching time of the transistor an impurity which reduces the lifetime of the charge carriers, for example, gold, is then diffused into the collector region and the base region of the transistor via the substrate 1. The arrow F diagrammatically shows the path of the diffusing impurities. The impurity can diffuse between the parts $4_1$ and $4_2$ of the buried layer without hindrance and then spread till above said parts in the collector region and the base region.

The arrows I show the current paths between the emitter regions 8 and the collector regions 9. The parts $4_1$ and $4_2$ of the buried layer are situated in said current paths and FIG. 1*d* clearly shows that the resistance of said current paths cannot be influenced by the fact that the buried layer consists of parts $4_1$ and $4_2$ separated from each other.

The diffusion treatments are not described in detail since these are universally known.

It will be obvious that the invention is not restricted to the example described and that many variations are possible to those skilled in the art without departing therefor from the scope of this invention. For example, more than two emitter regions and two collector contact regions may be present with an associated part of the buried layer. Alternatively, for example, only one annular emitter region may be present which is surrounded by an annular collector contact region and in which said annular regions are situated above an annular buried layer.

I claim:

1. A semiconductor device having a transistor, said transistor comprising a semiconductor substrate body having top and bottom major surfaces and an epitaxial layer on its top surface; said transistor further comprising a surface base region in the epitaxial layer and spaced from the substrate, a surface emitter region nested in the base region, and a collector region; said collector region comprising a part of the epitaxial layer completely surrounding the base region and extending to the epitaxial layer surface and of relatively high resistivity, a collector contact surface region of relatively low resistivity and laterally spaced from the base region, and a buried layer of relatively low resistivity and located at the epitaxial layer substrate interface and extending directly underneath the collector contact region and up to and underneath only that portion of the base region directly surrounding the emitter region such that a substantial part of the epitaxial layer extending underneath other lateral portions of the base region not directly surrounding the emitter region and the underlying epitaxial layer-substrate interface remain free of the buried layer; emitter, base, and collector connections to respectively the emitter, the base, and the collector contact regions at the epitaxial layer surface, and a carrier lifetime-reducing impurity in the substrate, the collector region and the base region, said carrier lifetime reducing impurity having been introduced into the transistor via the bottom surface of the substrate.

2. A semiconductor device as claimed in claim 1 wherein plural spaced but electrically interconnected surface emitter regions are nested within the said base region near its circumference, plural spaced but electrically interconnected surface collector contact regions are provided within the epitaxial layer each near an emitter region, and the buried layer comprises plural parts each situated directly below a collector contact and extending up to and underneath the part of the base region directly surrounding the emitter region nearest said collector contact.

3. A semiconductor device as set forth in claim 2, wherein the impurity is gold and is diffused within the substrate, the collector region and the base region via the entire bottom surface of the substrate.